United States Patent
Weng

(10) Patent No.: US 8,294,145 B1
(45) Date of Patent: Oct. 23, 2012

(54) ORGANIC LIGHT EMITTING DIODE DEVICE

(75) Inventor: Shou-cheng Weng, Changhua (TW)

(73) Assignee: Chunghwa Picture Tubes, Ltd., Bade, Taoyuan County (TW)

( * ) Notice: Subject to any disclaimer, the term of this patent is extended or adjusted under 35 U.S.C. 154(b) by 0 days.

(21) Appl. No.: 13/158,379

(22) Filed: Jun. 11, 2011

(30) Foreign Application Priority Data

Apr. 8, 2011 (TW) .............................. 100112314 A

(51) Int. Cl.
*H01L 29/08* (2006.01)
(52) U.S. Cl. .................................. 257/40; 257/E51.022
(58) Field of Classification Search ............. 257/40, 257/E51.022
See application file for complete search history.

(56) References Cited

U.S. PATENT DOCUMENTS

| 7,196,360 | B2 * | 3/2007 | Seo et al. ....................... 257/101 |
| 2008/0277655 | A1 * | 11/2008 | Yamamoto et al. ............. 257/40 |
| 2011/0198577 | A1 * | 8/2011 | Kambe et al. ................... 257/40 |
| 2011/0303903 | A1 * | 12/2011 | Yoshinaga et al. .............. 257/40 |

FOREIGN PATENT DOCUMENTS

TW  I331485  10/2010

\* cited by examiner

*Primary Examiner* — Trung Q Dang
(74) *Attorney, Agent, or Firm* — Cheng-Ju Chiang

(57) ABSTRACT

An organic light emitting diode device is disclosed. The organic light emitting diode device includes a substrate, a first electrode layer, a first insulating layer, at least one controlling electrode layer, a second insulating layer, at least one light emitting layer, a third insulating layer, and a second electrode layer. The first electrode layer is formed on the substrate and includes a first area and a second area adjacent to the first area. The first insulating layer, the controlling electrode layer, and the second insulating layer are sequentially formed on the first area. The light emitting layer is formed on the second area. The second electrode layer is formed on the light emitting layer. In the present invention, the controlling electrode layer controls a recombination region of electron-hole pair so as to achieve an objective of adjusting a color temperature.

10 Claims, 5 Drawing Sheets

ORGANIC LIGHT EMITTING DIODE DEVICE

BACKGROUND OF THE INVENTION

1. Field of the Invention

The present invention generally relates to an organic light emitting diode device, and more particularly to an organic light emitting diode device of which a color temperature is adjustable.

2. Description of Prior Art

An organic light emitting diode (OLED) device can be used as a light source for display devices and illuminating devices. The organic light emitting diode device mainly comprises a substrate, an anode disposed on the substrate, a light emitting layer disposed on the anode, and a cathode disposed on the light emitting layer.

When a potential is applied between the anode and the cathode, holes are injected from the anode to the light emitting layer and electros are injected from the cathode to the light emitting layer. The holes and the electrons recombine in the light emitting layer. The recombination of the electron holes and the electrons will release energy which will excite carriers in the light emitting layer to emit light, and thus the light emitting diode device is also called an electroluminescent (EL) device.

A color temperature refers to a color change which human eyes senses when the energy level of the light is different. In the organic light emitting diode device, the color temperature is controlled by a carrier concentration of the light emitting layer. When the carrier concentration of the light emitting layer is fixed, the color temperature which the organic light emitting diode device can show cannot be adjusted any more. Accordingly, applications of the organic light emitting diode device are limited.

Thus, there is a need to solve the above-mentioned problem that the color temperature is not adjustable.

SUMMARY OF THE INVENTION

An objective of the present invention is to provide an organic light emitting diode device of which a color temperature is adjustable.

According to an aspect of the present invention, the organic light emitting diode device comprises a substrate, a first electrode layer, a first insulating layer, at least one controlling electrode layer, a second insulating layer, at least one light emitting layer, a third insulating layer, and a second electrode layer. The first electrode layer is formed on the substrate. The first electrode layer comprises a first area and a second area adjacent to the first area and provides one of a plurality of first carriers and a plurality of second carriers. The first insulating layer is formed on the first area. The controlling electrode layer is formed on the first insulating layer. The second insulating layer is formed on the controlling electrode layer. The light emitting layer is formed on the second area for emitting light. The third insulating layer is formed between the controlling electrode layer and the light emitting layer. The second electrode layer is formed on the light emitting layer and provides the other one of the first carriers and the second carriers. The controlling electrode layer controls a recombination region of the first carriers and the second carriers in the light emitting layer for controlling the light emitting layer to emit light.

The organic light emitting diode device according to the present invention controls the recombination region of the first carriers and the second carriers in the light emitting layer by applying a potential to the controlling electrode layer, so that the color temperature is adjustable.

DETAILED DESCRIPTION OF THE INVENTION

Figure 1:
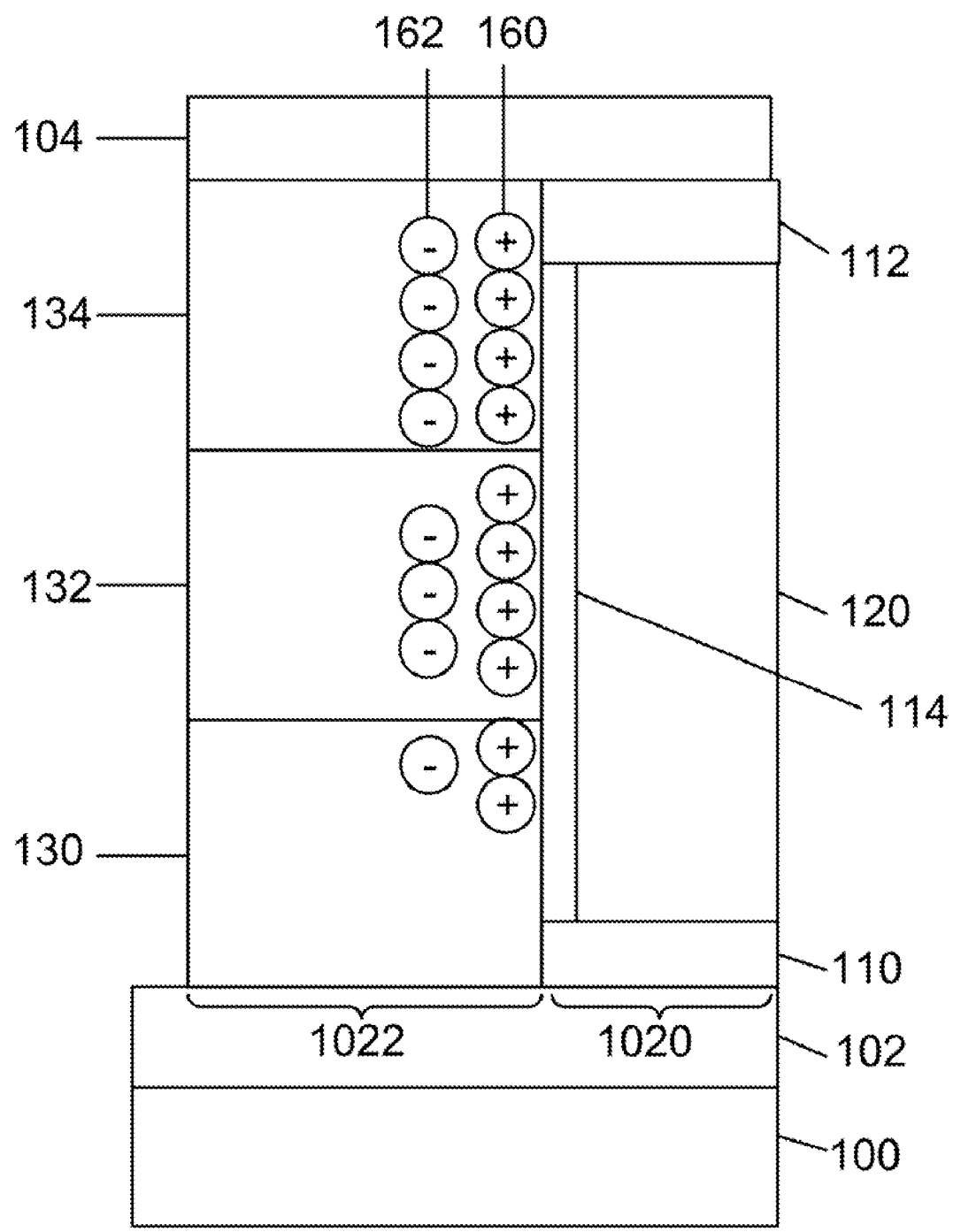
FIG. 1 illustrates an organic light emitting diode device in accordance with a first embodiment of the present invention.

Please refer to FIG. 1, which illustrates an organic light emitting diode device in accordance with a first embodiment of the present invention. The organic light emitting diode device comprises a substrate 100, a first electrode layer 102, a first insulating layer 110, a controlling electrode layer 120, a second insulating layer 112, at least one light emitting layer (represented by a blue light emitting layer 130, a green light emitting layer 132, and a red light emitting layer 134), a third insulating layer 114, and a second electrode layer 104.

The first electrode layer 102 is formed on the substrate 100. The first electrode layer 102 comprises a first area 1020 and a second area 1022 adjacent to the first area 1020. The first insulating layer 110 is formed on the first area 1020 for preventing the first electrode layer 102 from being electrically conducted to the controlling electrode layer 120. The controlling electrode layer 120 is formed on the first insulating layer 110. The second insulating layer 1120 is formed on the controlling electrode layer 120 for preventing the controlling electrode layer 120 from being electrically conducted to the second electrode layer 104. The blue light emitting layer 130, the green light emitting layer 132, and the red light emitting layer 134 are formed on the second area 1022 in sequence. The third insulating layer 114 is formed between the controlling electrode layer 120 and the blue light emitting layer 130, the green light emitting layer 132, and the red light emitting layer 134. Since the blue light emitting layer 130, the green light emitting layer 132, and the red light emitting layer 134 are made of semiconductor materials, such that the third insulating layer 114 prevents the controlling electrode layer 120 from being electrically conducted to the blue light emitting layer 130, the green light emitting layer 132, and the red light emitting layer 134. The second electrode layer 104 is formed on the red light emitting layer 134. It is noted that in the present embodiment, the organic light emitting diode device comprises the blue light emitting layer 130, the green light emitting layer 132, and the red light emitting layer 134. In another embodiment, the organic light emitting diode device can comprise only one of the blue light emitting layer 130, the green light emitting layer 132, and the red light emitting layer 134 for showing only one color.

In the present embodiment, the first electrode layer 102 and the second electrode layer 104 respectively serve as an anode and a cathode. In another embodiment, the first electrode layer 102 and the second electrode 104 respectively serve as a cathode layer and an anode. When a potential (not shown) is applied between the first electrode layer 102 and the second electrode layer 104, the first electrode layer 102 provides a plurality of holes 160 and the second electrode layer 104 provides a plurality of electrons 162. The holes 160 and the electrons 162 recombine in the blue light emitting layer 130, the green light emitting layer 132, and the red light emitting layer 134 so that the blue light emitting layer 130, the green light emitting layer 132, and the red light emitting layer 134 respectively emit different colors of light. A characteristic of the present invention further comprises the controlling electrode layer 120. When the blue light emitting layer 130, the green light emitting layer 132, and the red light emitting layer 134 emit light, a potential can be applied to the controlling electrode layer 120 for controlling a recombination region of the holes 160 and the electrons 162 in the blue light emitting layer 130, the green light emitting layer 132, and the red light emitting layer 134. For example, when an absolute value of the potential applied to the controlling electrode layer 120 is greater, most of the holes 160 and the electrons 162 recombine near the third insulating layer 114 and least of the holes 160 and the electrons 162 recombine far away from the third insulating layer 114.

Furthermore, when a positive potential is applied to the controlling electrode layer 120, a mobility of the holes 160 is faster than a mobility of the electrons 162. Accordingly, most of the holes 160 and the electrons 162 recombine in the green light emitting layer 132 or the red light emitting layer 134. When the positive potential applied to the controlling electrode layer 120 is greater, most of the holes 160 and the electrons 162 recombine in the red light emitting layer 134 as shown in FIG. 1. As a result, the color temperature of the light which is mixed by the blue light emitting layer 130, the green light emitting layer 132, and the red light emitting layer 134 can be warm. In contrast, when a negative potential is applied to the controlling electrode layer 120, the mobility of the holes 160 is faster than the mobility of the electrons 162. Accordingly, most of the holes 160 and the electrons 162 recombine in the blue light emitting layer 130 or the green light emitting layer 132. When an absolute value of the negative potential applied to the controlling electrode layer 120 is greater, most of the holes 160 and the electrons 162 recombine in the blue light emitting layer 130. In conclusion, the color temperature of the organic light emitting diode device is adjustable by controlling the absolute value of the potential applied to the controlling electrode layer 120. For instance, the color temperature is adjustable when the organic light emitting diode is serving as an illuminating device.

Figure 2:
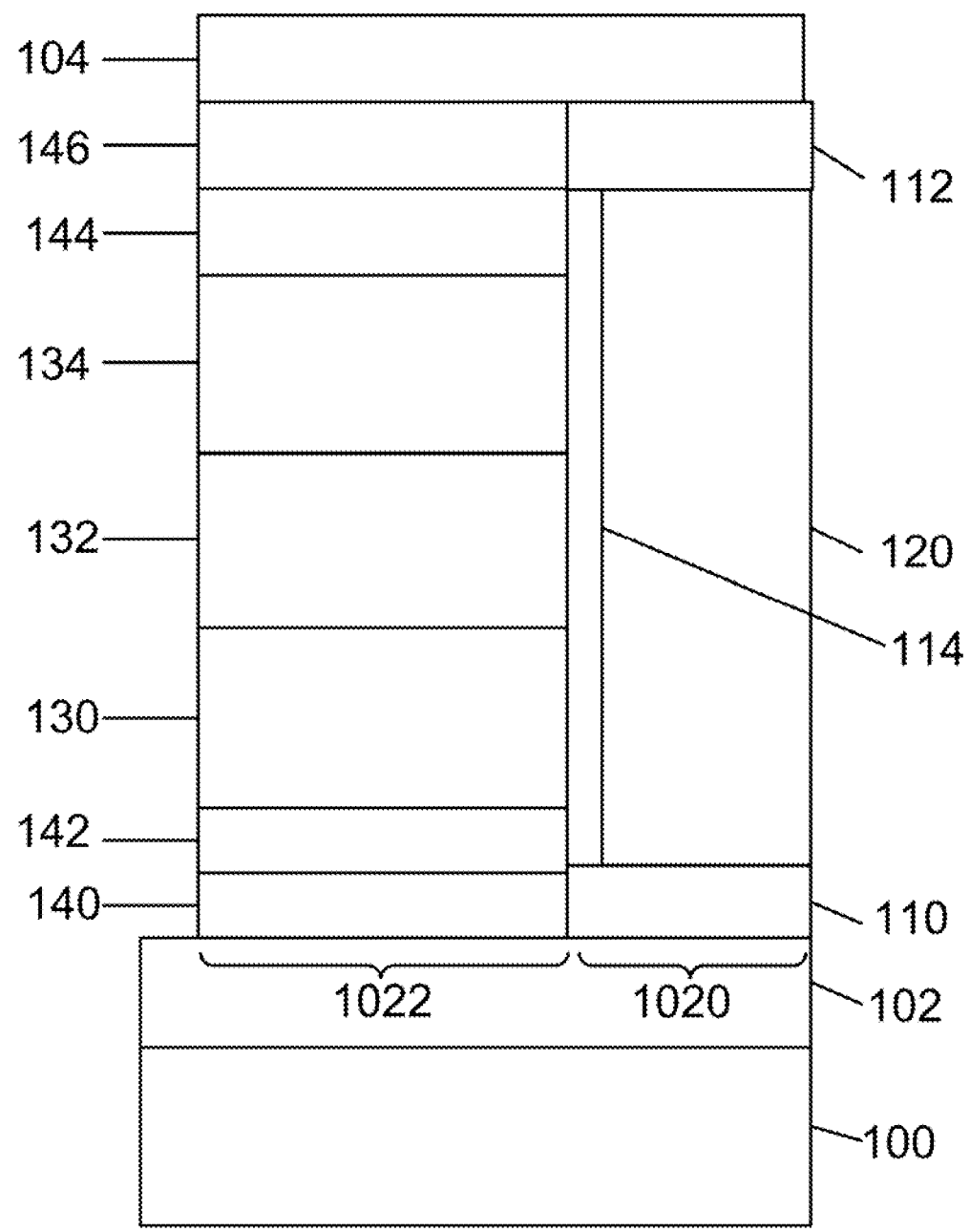
FIG. 2 illustrates an organic light emitting diode device in accordance with a second embodiment of the present invention.

Please refer to FIG. 2, which illustrates an organic light emitting diode device in accordance with a second embodiment of the present invention. A difference between the present embodiment and the first embodiment is that in the present embodiment, the organic light emitting diode device further comprises a first carrier injection layer 140 and a first carrier transport layer 142 formed in sequence between the first electrode layer 102 and the blue light emitting layer 130 (i.e. one of the three light emitting layers that is closest to the first electrode layer 102), and a second carrier transport layer 144 and a second carrier injection layer 146 formed in sequence formed between the red light emitting layer 134 (i.e. one of the three light emitting layer that is closest to the second electrode layer 104) and the second electrode layer 104. When the first electrode layer 102 is serving as an anode and the second electrode layer 104 is serving as a cathode, the first carrier injection layer 140 is a hole injection layer, the first carrier transport layer 142 is a hole injection layer, the second carrier transport layer 144 is an electron transport layer, and the second carrier injection layer 146 is an electron injection layer. When the first electrode layer 102 is serving as a cathode and the second electrode layer 104 is serving as an anode, the first carrier injection layer 140 is an electron injection layer, the first carrier transport layer 142 is an electron injection layer, the second carrier transport layer 144 is a hole transport layer, and the second carrier injection layer 146 is a hole injection layer.

It is noted that the first carrier injection layer 140 is functioning to increase an efficiency of injecting the first carriers from the first electrode layer 102 to the blue light emitting layer 130, the green light emitting layer 132, and the red light emitting layer 134, and the second carrier injection layer 140 is functioning to increase an efficiency of injecting the second carriers from the second electrode layer 104 to the blue light emitting layer 130, the green light emitting layer 132, and the red light emitting layer 134. The first carrier transport layer 142 is functioning to increase the mobility of the first carriers, and the second carrier transport layer 144 is functioning to increase the mobility of the second carriers. At least one of the carrier injection layer 140, the first carrier transport layer 142, the second carrier transport layer 144, and the second carrier injection layer 146 can be selectively formed to increase a probability of recombination of the first carriers and the second carriers in the blue light emitting layer 130, the green light emitting layer 132, and the red light emitting layer 134, whereby the light efficiencies of the blue light emitting layer 130, the green light emitting layer 132, and the red light emitting layer 134 can be increased.

Figure 3:
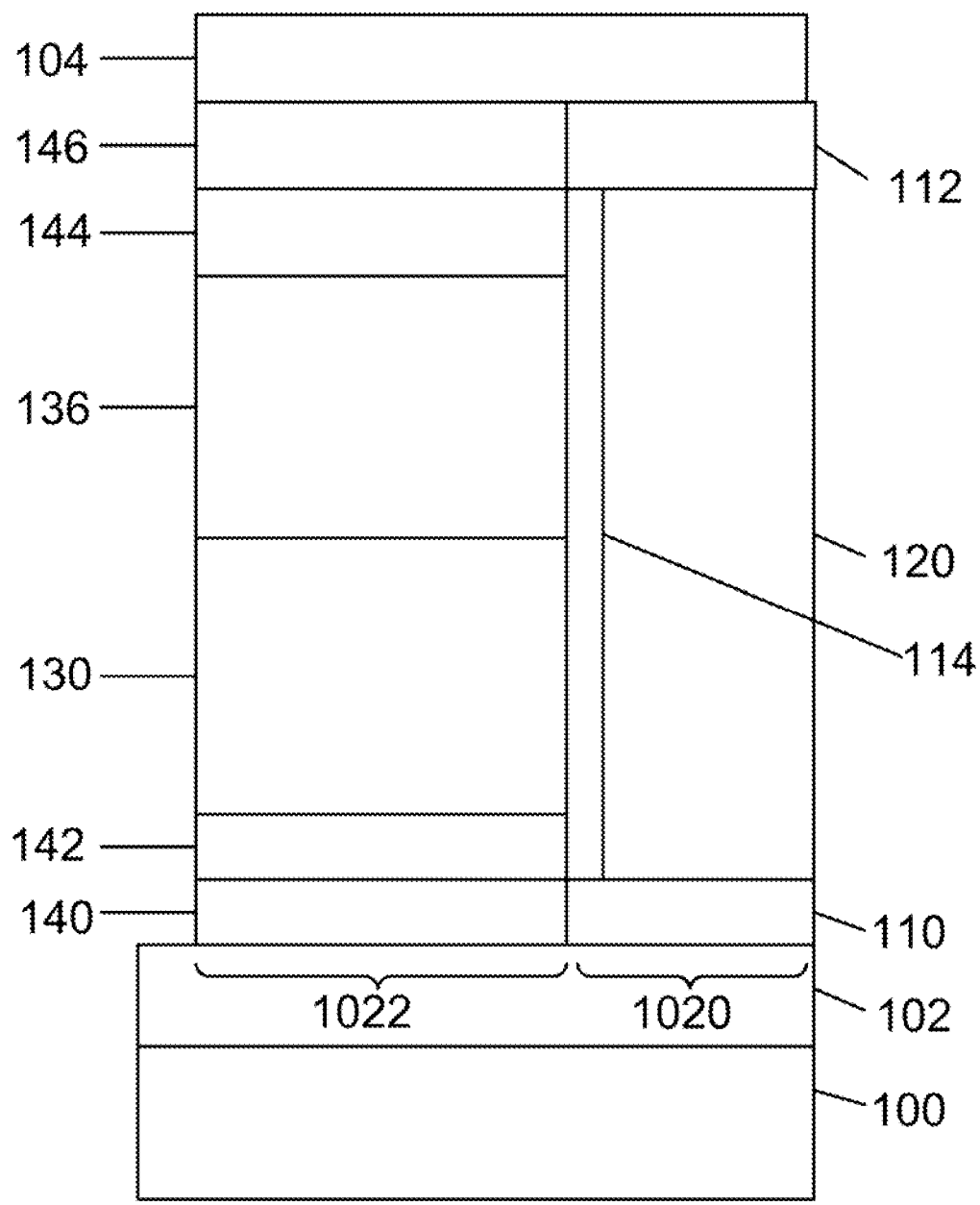
FIG. 3 illustrates an organic light emitting diode device in accordance with a third embodiment of the present invention.

Please refer to FIG. 3, which illustrates an organic light emitting diode device in accordance with a third embodiment of the present invention. A difference between the present embodiment and the second embodiment shown in FIG. 2 is that in the present embodiment, the organic light emitting diode device comprises two light emitting layers, i.e. the blue light emitting layer 130 and a yellow light emitting layer 136, which are formed in sequence on the first carrier transport layer 142 on the second area 1022. In the second embodiment shown in FIG. 2, a white light is formed by mixing lights of the blue light emitting layer 130, and the green light emitting layer 132, and the red light emitting layer 134. Since a yellow light is formed by mixing by a green light and a red light, a white light is formed by mixing lights of the blue light emitting layer 130 and the yellow light emitting layer 136 in the present embodiment.

Figure 4:
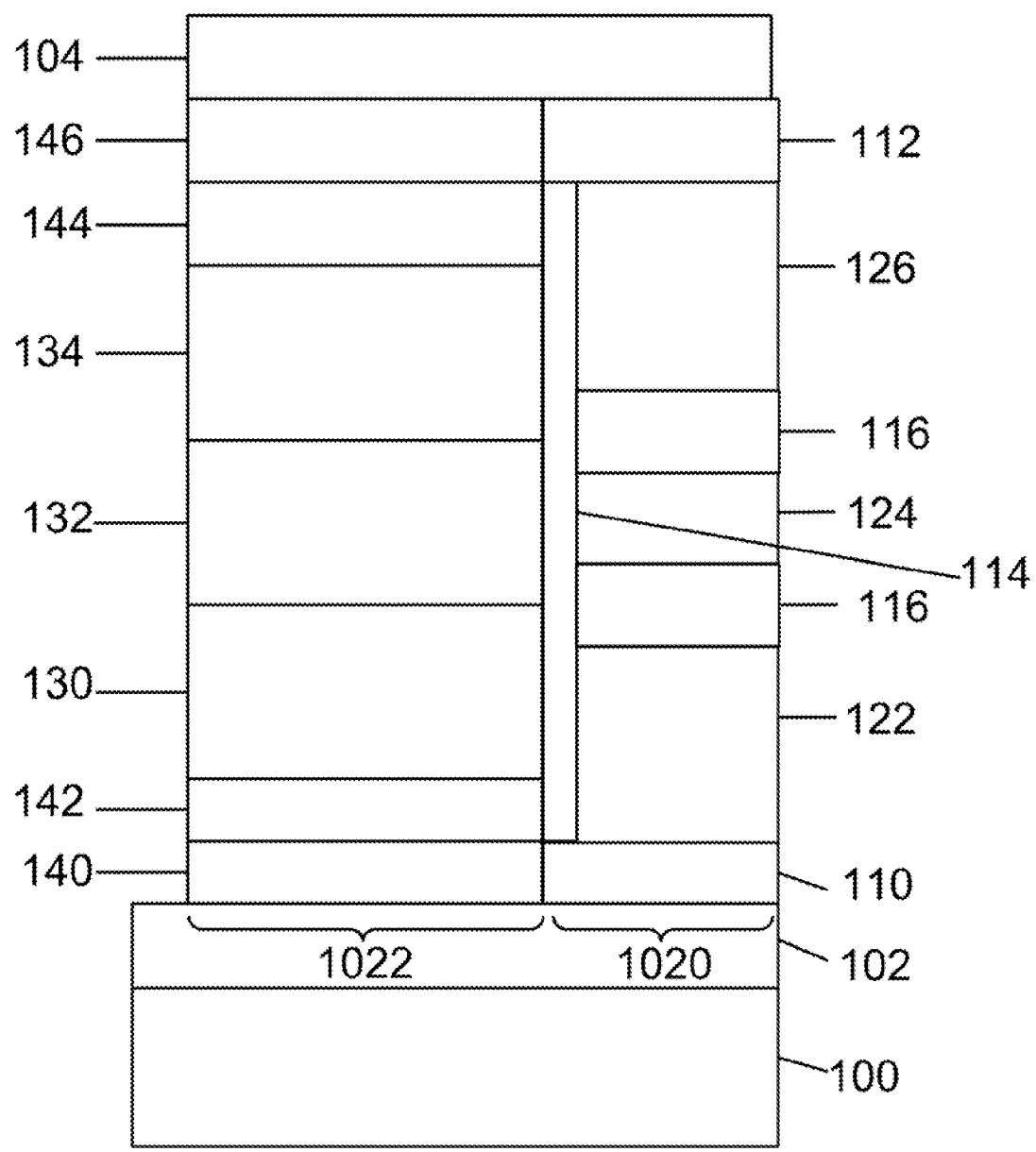
FIG. 4 illustrates an organic light emitting diode device in accordance with a fourth embodiment of the present invention.

Please refer to FIG. 4, which illustrates an organic light emitting diode device in accordance with a fourth embodiment of the present invention. A difference between the present embodiment and the second embodiment shown in FIG. 2 is that in the present embodiment, the organic light emitting diode device comprises a plurality of controlling electrode layers 122, 124, 126. Separating insulating layers 116 are formed between the controlling electrode layers 122, 124 and the controlling electrode layers 124, 126. The separating insulating layers 116 prevent the controlling electrode layers 122, 124, 126 from being conducted. The blue light emitting layer 130, the green light emitting layer 132, and the red light emitting layer 134 are respectively controlled by the controlling electrode layers 122, 124, 126. In the present embodiment, different potentials can be applied to the controlling electrode layers 122, 124, 126, so that the organic light emitting diode device can show more different color temperatures.

Figure 5:
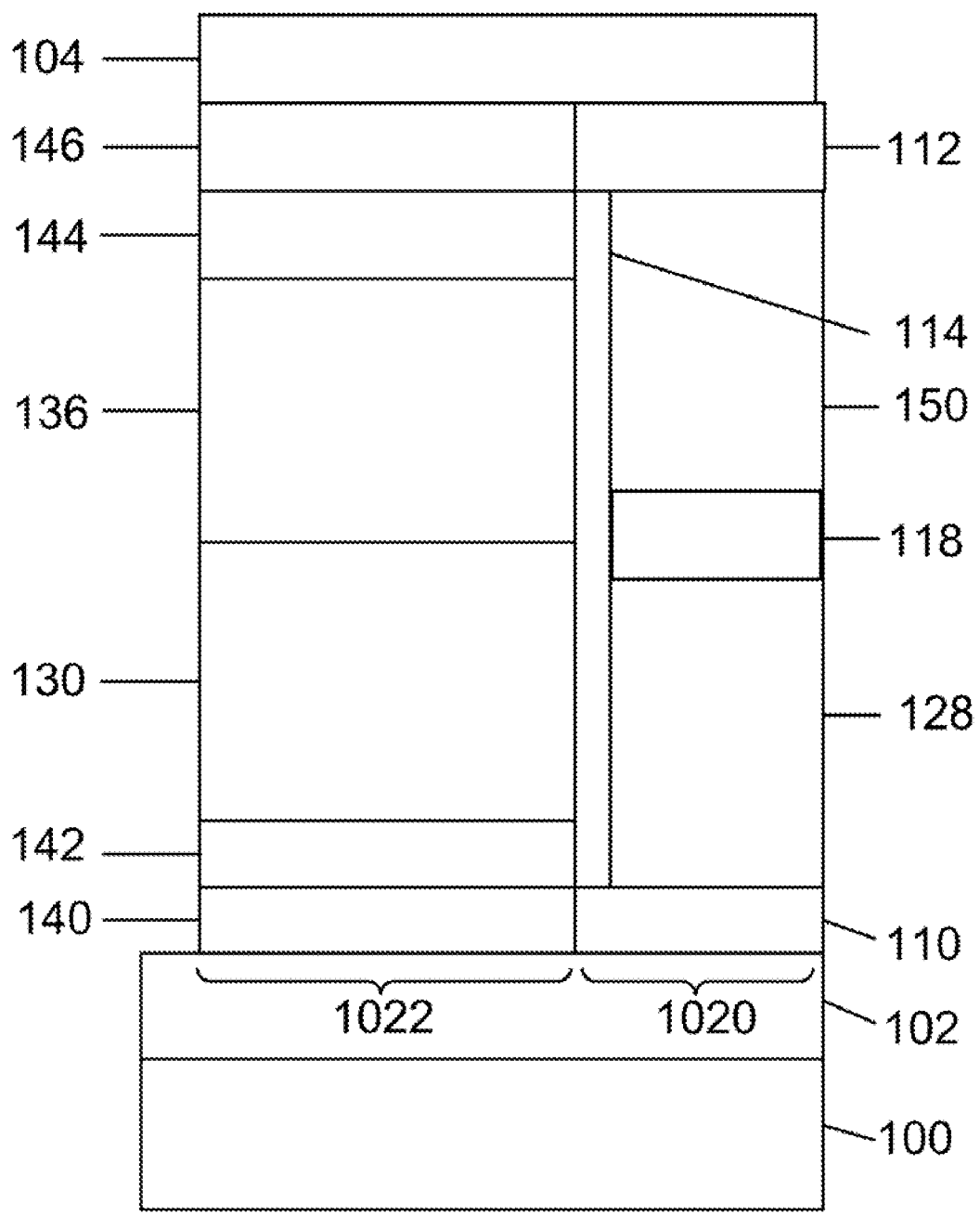
FIG. 5 illustrates an organic light emitting diode device in accordance with a fifth embodiment of the present invention.

Please refer to FIG. 5, which illustrates an organic light emitting diode device in accordance with a fifth embodiment of the present invention. A difference between the present embodiment and the third embodiment shown in FIG. 3 is that in the present embodiment, the organic light emitting diode device comprises a plurality of controlling electrode layers 128, 150. A separating insulating layer 118 is formed between the controlling electrode layers 128, 150. The blue light emitting layer 130 and the yellow light emitting layer 136 are respectively controlled by the controlling electrode layers 128, 150. In the present embodiment, different potentials can be applied to the controlling electrode layers 128, 150, so that the organic light emitting diode device can show more different color temperatures.

It is noted that in the first to the fifth embodiments, the light emitting layers are not limited to blue, green, red, or yellow. The light emitting layers can comprise other colors. Furthermore, an arrangement sequence of the light emitting layers is not limited to the above-mentioned embodiments.

In the above-mentioned embodiments, the substrate 100 includes a flexible substrate or a rigid substrate. The flexible substrate can be made of polyethylene terephthalate (PET) or polyimide. The rigid substrate can be made of glass. The first electrode layer 102 can be made of at least one material selected from a group consisting of aurum, aluminum, copper, chromium, molybdenum, tantalum, and indium tin oxide (ITO). The first insulating layer 110, the second insulating layer 112, and the separating insulating layer 116, 118 can be made of at least one material selected from a group consisting of silicon oxide (SiOx), silicon nitride (SiNx), and $Al_2O_3$. The controlling electrode layers 120, 122, 124, 126, 128, 150 can be made of aluminum or tantalum. The second electrode layer 104 can be made of at least one material selected from a group consisting of aurum, aluminum, and indium tin oxide. The third insulating layer 114 is formed on side surfaces of the controlling electrode layers 120, 122, 124, 126, 128, 150 by oxidizing the side surfaces of the controlling electrode layers 120, 122, 124, 126, 128, 150 with chemical reactions (including electrochemical processes). For example, if the controlling electrode layers 120, 122, 124, 126, 128, 150 are made of aluminum, the side surfaces of the controlling electrode layers 120, 122, 124, 126, 128, 150 are oxidized into $Al_2O_3$. If the controlling electrode layers 120, 122, 124, 126, 128, 150 are made of tantalum, the side surfaces of the controlling electrode layers 120, 122, 124, 126, 128, 150 are oxidized into $Ta_2O_5$. As a result, the side surfaces of the controlling electrode layers 120, 122, 124, 126, 128, 150 are densely covered and with high-k dielectric (high dielectric constant), whereby a range for applying a potential to the controlling electrode layers 120, 122, 124, 126, 128, 150 and an ON/OFF current ratio of the electrode layers 120, 122, 124, 126, 128, 150 can be increased for achieving the objective of more accurately adjusting the color temperature.

The organic light emitting diode device in accordance with the present invention is capable of utilizing a controlling electrode layer to control at least one light emitting layer as shown in FIGS. 1-3, or utilizing a plurality of controlling electrode layers to respectively control a plurality of light emitting layers as shown in FIGS. 4-5 so as to achieve the objective of adjusting the color temperature.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. An organic light emitting diode device, comprising:
a substrate;
a first electrode layer formed on the substrate, the first electrode layer comprising a first area and a second area adjacent to the first area and providing a plurality of first carriers and a plurality of second carriers;
a first insulating layer formed on the first area;
at least one controlling electrode layer formed on the first insulating layer;
a second insulating layer formed on the controlling electrode layer;
at least one light emitting layer formed on the second area for emitting light;
a third insulating layer formed between the controlling electrode layer and the light emitting layer; and
a second electrode layer formed on the light emitting layer and providing the other one of the first carriers and the second carriers;
wherein the controlling electrode layer controls a recombination region of the first carriers and the second carriers in the light emitting layer for controlling the light emitting layer to emit light.

2. The organic light emitting diode device as claimed in claim 1, wherein the first carriers are one of holes and electrons, and the second carriers are the other one of the holes and the electrons.

3. The organic light emitting diode device as claimed in claim 1, further comprising a first carrier injection layer formed between the first electrode layer and the light emitting layer for increasing an efficiency of injecting the first carriers from the first electrode layer to the light emitting layer.

4. The organic light emitting diode device as claimed in claim 1, further comprising a first carrier transport layer formed between the first electrode layer and the light emitting layer for increasing a mobility of the first carriers.

5. The organic light emitting diode device as claimed in claim 1, further comprising a second carrier transport layer formed between the light emitting layer and the second electrode layer for increasing a mobility of the second carriers.

6. The organic light emitting diode device as claimed in claim 1, further comprising a second carrier injection layer formed between the light emitting layer and the second electrode layer for increasing an efficiency of injecting the second carriers from the second electrode layer to the light emitting layer.

7. The organic light emitting diode device as claimed in claim 1, wherein the at least one light emitting layer comprises a blue light emitting layer, a green light emitting layer, and a red light emitting layer.

8. The organic light emitting diode device as claimed in claim 1, wherein one of the first electrode layer and the second electrode layer is serving as an anode, and the other one of the first electrode layer and the second electrode layer is serving as a cathode.

9. The organic light emitting diode device as claimed in claim 1, wherein the organic light emitting diode device comprises a plurality of controlling electrode layers and a plurality of light emitting layers, and a separating insulating layer is formed between two adjacent controlling electrode layers.

10. The organic light emitting diode device as claimed in claim 9, wherein one of the controlling electrode layers controls a recombination region of the first carriers and the second carriers in one of the light emitting layers for controlling the one of the light emitting layers to emit light.

* * * * *